(12) United States Patent
Lee et al.

(10) Patent No.: US 12,688,899 B2
(45) Date of Patent: Jul. 21, 2026

(54) DEVICE PROVIDING IMPROVED FAIL BIT COUNT OPERATION

(71) Applicant: Samsung Electronics Co., Ltd., Suwon-si (KR)

(72) Inventors: Eunchan Lee, Suwon-si (KR); Jungyu Lee, Suwon-si (KR); Yumin Kim, Suwon-si (KR); Jihyun Park, Suwon-si (KR); Jayang Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 349 days.

(21) Appl. No.: 18/471,430

(22) Filed: Sep. 21, 2023

(65) Prior Publication Data

US 2024/0233844 A1 Jul. 11, 2024

(30) Foreign Application Priority Data

Jan. 11, 2023 (KR) ........................ 10-2023-0004309
Mar. 10, 2023 (KR) ........................ 10-2023-0032003

(51) Int. Cl.
*G11C 16/34* (2006.01)
*G11C 16/04* (2006.01)
*G11C 16/08* (2006.01)
*G11C 16/10* (2006.01)
*G11C 16/24* (2006.01)

(52) U.S. Cl.
CPC ...... *G11C 16/3495* (2013.01); *G11C 16/0483* (2013.01); *G11C 16/08* (2013.01); *G11C 16/10* (2013.01); *G11C 16/24* (2013.01); *G11C 16/3459* (2013.01)

(58) Field of Classification Search
CPC . G11C 16/3495; G11C 16/0483; G11C 16/08; G11C 16/10; G11C 16/24; G11C 16/3459
USPC ...................................................... 365/185.09
See application file for complete search history.

(56) References Cited

U.S. PATENT DOCUMENTS

| | | | |
|---|---|---|---|
| 2012/0314500 A1 | 12/2012 | Song et al. | |
| 2013/0286746 A1* | 10/2013 | Choi .................. | G11C 16/3454 365/185.22 |
| 2014/0056083 A1 | 2/2014 | Yang et al. | |

(Continued)

FOREIGN PATENT DOCUMENTS

| | | | |
|---|---|---|---|
| KR | 20100054476 A | 5/2010 | |
| KR | 20220095078 A * | 7/2022 | ......... H03F 3/45183 |

*Primary Examiner* — Amir Zarabian
*Assistant Examiner* — Daniel John King
(74) *Attorney, Agent, or Firm* — Wolf, Greenfield & Sacks, P.C.

(57) ABSTRACT

A device includes a first current mirror circuit including a plurality of first transistors, the plurality of first transistors including a common gate configured to receive a decoding signal according to a number of fail bits that are program-failed, a second current mirror circuit including a plurality of second transistors including a common gate configured to receive a reference current signal and a plurality of resistors respectively electrically connected to respective first terminals of the second transistors, and a comparison circuit configured to determine a compared result by comparing a first voltage corresponding to the decoding signal with respective ones of a plurality of second voltages output from the second current mirror circuit and configured to output a count signal corresponding to the compared result.

20 Claims, 13 Drawing Sheets

(56)     References Cited

U.S. PATENT DOCUMENTS

| 2017/0117055 | A1 | 4/2017 | Kim et al. |
| 2017/0221567 | A1 | 8/2017 | Yamauchi et al. |
| 2017/0221585 | A1 | 8/2017 | Lee |

* cited by examiner

| Voltage Level | OUT<> | PASS Reference |
|---|---|---|
| VCR1 ———————— | 1 | 1 |
| VCR2 ———————— | 1 | 1 |
| VCR3 ———————— | 1 | 1 |
| VCR4 ———————— | 1 | 0 |
| VCR5 ———————— | 1 | 0 |
| VCR6 ———————— | 1 | 0 |
| VCR7 ———————— | 1 | 0 |
| VCR8 ———————— | 1 | 0 |
| VDS — — — — — — — — — | | |
| VCR9 ———————— | 0 | 0 |
| VCR10 ———————— | 0 | 0 |

FIG. 12

| Voltage Level | | OUT<> | PASS Reference |
|---|---|---|---|
| VCR1 | | 1 | 1 |
| VCR2 | | 1 | 1 |
| VCR3 | | ? | 1 |
| VCR4 (var) | | 0 | 0 |
| VCR5 | | 0 | 0 |
| VCR6 | | 0 | 0 |
| VCR7 | | 0 | 0 |
| VCR8 | | 0 | 0 |
| VCR9 | | 0 | 0 |
| VCR10 | | 0 | 0 |

VDS

FIG. 13

| Voltage Level | | OUT<> | PASS Reference |
|---|---|---|---|
| VCR1 | | 1 | 1 |
| VCR2 | | 1 | 1 |
| VCR3 | | 1 | 1 |
| VDS VCR4-1 | | 1 | 0 |
| VCR5 | | 0 | 0 |
| VCR6 | | 0 | 0 |
| VCR7 | | 0 | 0 |
| VCR8 | | 0 | 0 |
| VCR9 | | 0 | 0 |
| VCR10 | | 0 | 0 |

FIG. 14

| | Voltage Level | | OUT<> | PASS Reference |
|---|---|---|---|---|
| | VCR1 | ———————— | 1 | 1 |
| | VCR2 | ———————— | 1 | 1 |
| | VCR3 | ············ | 1 | 1 |
| VDS | — — — — — — — | | | |
| | VCR4-2 | ———————— | 0 | 0 |
| | VCR5 | ············ | 0 | 0 |
| | VCR6 | ············ | 0 | 0 |
| | VCR7 | ———————— | 0 | 0 |
| | VCR8 | ———————— | 0 | 0 |
| | VCR9 | ············ | 0 | 0 |
| | VCR10 | ———————— | 0 | 0 |

Applying program voltage to word line ———— S110

Applying verify voltage to word line ———— S120

Storing verification result into latches ———— S130

Generating DS corresponding to the verification result ———— S140

Counting the number of fail bits based on the DS ———— S150

200

Memory Controller (205)

ECC Circuit (210)

ADDR/CMD/DATA

Memory Device (215)

BLKm

⋮

BLKa

⋮

BLK2

BLK1

DEVICE PROVIDING IMPROVED FAIL BIT COUNT OPERATION

CROSS-REFERENCE TO RELATED APPLICATIONS

This application claims priority under 35 U.S.C. § 119 to Korean Patent Application Nos. 10-2023-0004309, filed on Jan. 11, 2023, and 10-2023-0032003, filed on Mar. 10, 2023, the disclosures of which are incorporated by reference herein in their entirety.

BACKGROUND

Embodiments of the present disclosure described herein relate to a device with improved fail bit count operation.

A semiconductor memory device is a memory device implemented using semiconductors such as silicon (Si), germanium (Ge), gallium arsenide (GaAs), indium phosphide (InP), or the like. The semiconductor memory device can be broadly classified into a volatile memory device or a nonvolatile memory device.

The semiconductor memory device is provided with various circuit structures and operating policies according to its generation.

SUMMARY

Embodiments of the present disclosure provide a device with improved fail bit count operation.

According to some embodiments, a device includes a first current mirror circuit including a plurality of first transistors, the plurality of first transistors including a common gate configured to receive a decoding signal according to a number of fail bits that are program-failed, a second current mirror circuit including a plurality of second transistors including a common gate configured to receive a reference current signal and a plurality of resistors respectively electrically connected to respective first terminals of the plurality of second transistors, and a comparison circuit configured to determine a compared result by comparing a first voltage corresponding to the decoding signal with respective ones of a plurality of second voltages output from the second current mirror circuit and configured to output a count signal corresponding to the compared result.

According to some embodiments, a memory device includes a memory cell array, a page buffer circuit electrically connected to the memory cell array via a bit line, wherein the page buffer circuit is configured to output a page buffer signal corresponding to a result of a verify operation with respect to a program operation, a page buffer decoder configured to decode the page buffer signal and output a decoding signal corresponding to fail bit information, a fail bit counter configured to output a count signal corresponding to a number of fail bits with respect to the program operation based on the decoding signal, and a control circuit configured to determine a program pass or a program fail of the program operation based on the count signal. The fail bit counter includes a first current mirror circuit configured to output a first voltage corresponding to the decoding signal, a plurality of transistors including a common gate configured to receive a reference current signal, wherein ones of the plurality of transistors further include respective first terminals electrically connected to the first current mirror circuit, and wherein the plurality of transistors are configured to output a plurality of comparative reference current signals obtained by mirroring the reference current signal, a plurality of resistors respectively electrically connected to respective second terminals of the plurality of transistors, and a comparison circuit configured to determine a compared result by comparing the first voltage corresponding to the decoding signal with respective ones of a plurality of second voltages corresponding to the plurality of comparative reference current signals and configured to output the count signal corresponding to the compared result.

According to some embodiments, a device includes a first current mirror circuit configured to receive a decoding signal according to a number of fail bits that are program-failed and configured to output a first voltage corresponding to the decoding signal, a second current mirror circuit configured to output a plurality of comparative reference current signals based on a reference current signal, and a comparison circuit configured to determine a compared result by comparing the first voltage with respective ones of a plurality of second voltages corresponding to the plurality of comparative reference current signals and configured to output a count signal corresponding to the compared result. The second current mirror circuit includes a first transistor including a first terminal configured to receive the reference current signal and a second terminal electrically connected to a first resistor, and a plurality of second transistors, the plurality of second transistors including a common gate that is electrically connected to a gate of the first transistor, respective first terminals through which the plurality of comparative reference current signals are configured to flow, and respective second terminals electrically connected to respective ones of a plurality of second resistors.

According to some embodiments, the device with improved fail bit count operation is provided.

BRIEF DESCRIPTION OF THE DRAWINGS

The above and other objects and features of the present disclosure will become apparent by describing in detail embodiments thereof with reference to the accompanying drawings.

FIGS. 11 to 14 are diagrams illustrating count signals of fail bit counters according to some embodiments of the present disclosure;

DETAILED DESCRIPTION

Below, embodiments of the present disclosure will be described in detail and clearly to such an extent that one of ordinary skill in the art can easily implement the disclosure.

Figure 1:
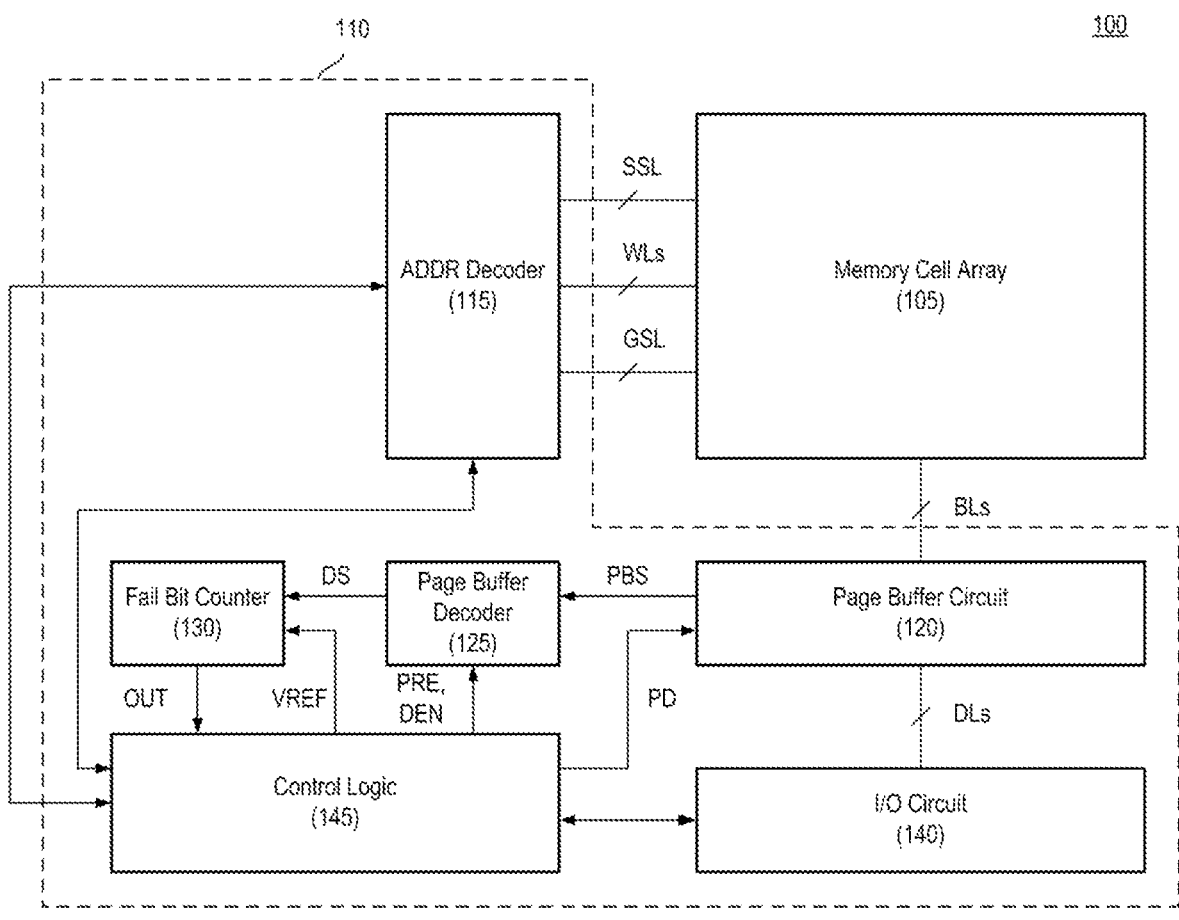
FIG. 1 is a block diagram illustrating a memory device according to some embodiments of the present disclosure.

FIG. 1 is a block diagram illustrating a memory device 100 according to some embodiments of the present disclosure.

Referring to FIG. 1, the memory device 100 may include a memory cell array 105 and a peripheral circuit 110 connected to the memory cell array 105. The peripheral circuit 110 may include an address decoder 115, a page buffer circuit 120, a page buffer decoder 125, a fail bit counter 130, an input/output (I/O) circuit 140, and a control logic 145 (also referred to as a control circuit).

The memory cell array 105 may include a plurality of memory blocks. Each of the memory blocks may have a two-dimensional structure or a three-dimensional structure. In the memory block having the two-dimensional structure (or a horizontal structure), memory cells may be formed in a horizontal direction with respect to a substrate. In the memory block having the three-dimensional structure (or a vertical structure), the memory cells may be formed in a vertical direction with respect to the substrate. Multi-bit data may be stored in each of the memory cells.

The address decoder 115 may be connected to the memory cell array 105 via row lines. In this case, the row lines may include selection lines, such as a string selection line SSL and/or a ground selection line GSL, and word lines WLs. In addition, according to some embodiments, the row lines may further include dummy word lines disposed adjacent to the selection lines. Further, in a case where the memory cell array 105 has a multi-stack structure in which two or more stacks are stacked, the row lines may further include dummy word lines connected to dummy cells placed at a junction of the multi-stack structure.

The address decoder 115 may select one of the memory blocks in response to a control of the control logic 145. In addition, the address decoder 115 may select one of the word lines WLs during a program operation.

The page buffer circuit 120 may be connected to the memory cell array 105 via column lines. As an example, the column lines may include bit lines BLs. The page buffer circuit 120 may temporarily store data to be programmed in a selected page or data read from the selected page. The page buffer circuit 120 may output the read data to the I/O circuit 140.

The page buffer circuit 120 may receive a driving signal PD from the control logic 145 and may output a page buffer signal PBS corresponding to a result of a verify operation based on the driving signal PD.

The page buffer decoder 125 may operate in response to a decoder enable signal DEN and a precharge signal PRE provided from the control logic 145. The page buffer decoder 125 may decode the page buffer signal PBS provided from the page buffer circuit 120 to obtain fail bit information and may output a decoding signal DS corresponding to the fail bit information to the fail bit counter 130.

The fail bit counter 130 may operate in response to a reference voltage VREF provided from the control logic 145. The fail bit counter 130 may generate reference currents from the reference voltage VREF to count the fail bit and may count the fail bit using the reference currents. The fail bit counter 130 may output a count signal OUT indicating the number of fail bits as a result of counting the fail bit.

The I/O circuit 140 may be internally connected to the page buffer circuit 120 via data lines DLs and may be externally connected to a memory controller via an input/output line. The I/O circuit 140 may receive data to be programmed in a selected memory cell of the memory cell array 105 from the memory controller during the program operation and may provide data read from the selected memory cell to the memory controller during a read operation.

The control logic 145 may control an overall operation of the memory device 100 in response to a command and an address provided from the memory controller. As an example, the control logic 145 may control the page buffer circuit 120 in response to transmitting the driving signal PD, may control the page buffer decoder 125 in response to transmitting the precharge signal PRE and the decoder enable signal DEN, and may control the fail bit counter 130 in response to transmitting the reference voltage VREF. As an example, the control logic 145 may receive the count signal OUT from the fail bit counter 130 and may obtain a digital value indicating the number of the fail bits from the count signal OUT. For example, the count signal OUT may indicate the number of the fail bits. For example, the control logic 145 may compare the obtained digital value with a specific value and may determine a program pass or a program fail for the program operation according to the compared result. In other words, the control logic 145 may determine a compared result by comparing the obtained digital value with a specific value and may determine a program pass or a program fail for the program operation according to the compared result. The control logic 145 may determine a program pass or a program fail of the program operation based on the count signal OUT.

Figure 2:
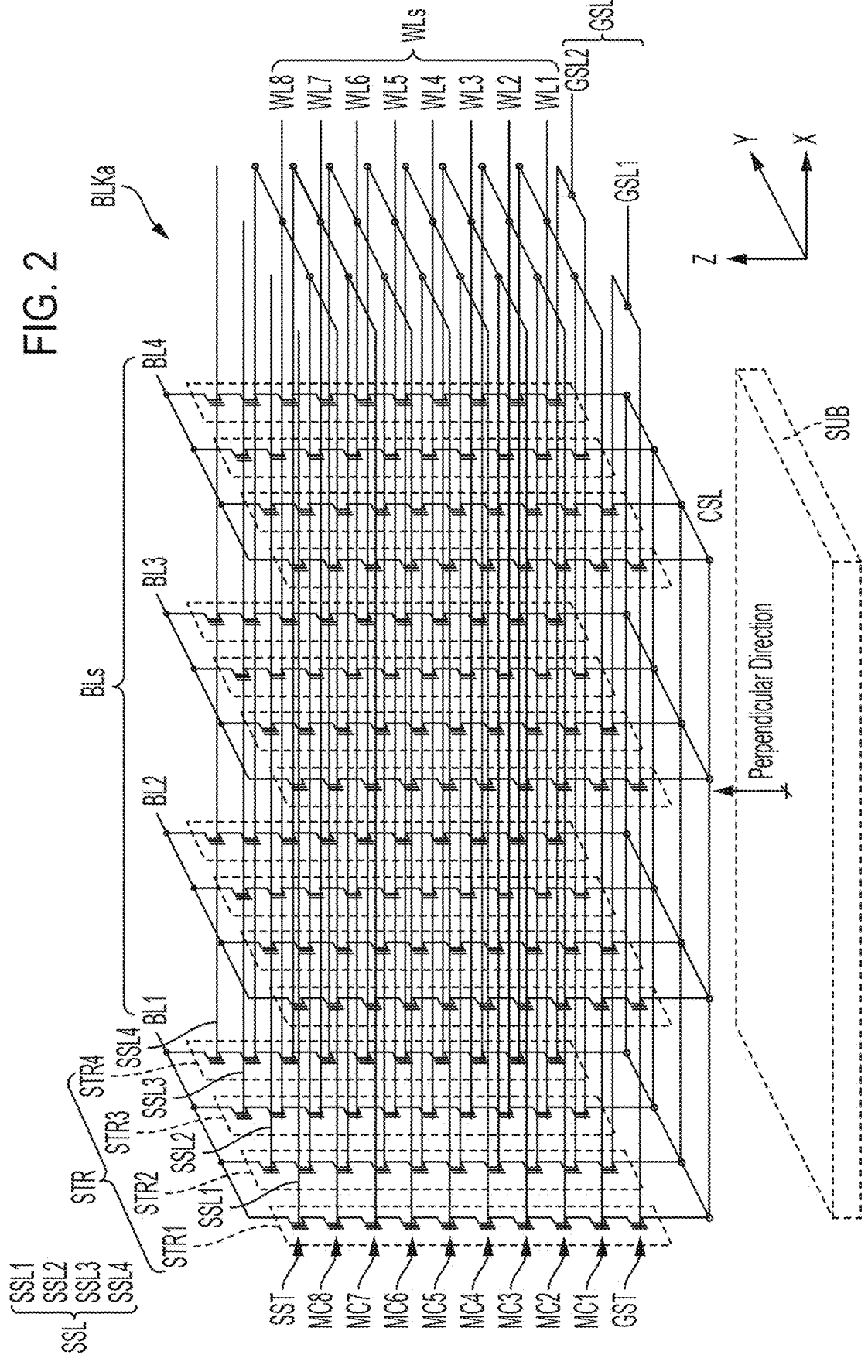
FIG. 2 is a circuit diagram illustrating one memory block among memory blocks of FIG. 1.

FIG. 2 is a circuit diagram illustrating one memory block among the memory blocks of FIG. 1.

Referring to FIG. 2, a plurality of strings STR may be arranged in rows and columns on a substrate SUB. The strings STR may be commonly connected to a common source line CSL formed on or in the substrate SUB. The location of the substrate SUB shown in FIG. 2 is an example to help understand the structure of the memory block BLKa.

FIG. 2 shows a structure in which the common source line CSL is connected to lower ends of the strings STR. However, the present disclosure is not limited thereto, and the common source line CSL is not necessarily physically located only at the lower ends of the strings STR as long as the common source line CSL is electrically connected to the lower ends of the strings STR. As an example, the strings STR shown in FIG. 2 are arranged in four rows by four columns (4×4), however, the memory block BLKa may include fewer or more strings.

The strings STR of each row may be commonly connected to a ground selection line GSL1 or GSL2. As an example, strings STR1 and STR2 of first and second rows may be commonly connected to a first ground selection line GSL1, and strings STR3 and STR4 of third and fourth rows may be commonly connected to a second ground selection line GSL2, however, these are merely examples. According to some embodiments, four different ground selection lines may be provided, and the strings STR may be implemented to be connected to ones of the ground selection lines different from each other.

The strings STR of each row may be connected to corresponding string selection lines among first, second, third, and fourth string selection lines SSL1, SSL2, SSL3, and SSL4. The strings STR of each column may be connected to a corresponding bit line among first, second, third, and fourth bit lines BL1, BL2, BL3, and BLA.

Each string STR may include at least one ground selection transistor GST connected to the ground selection line GSL1 or GSL2, a plurality of memory cells MC1 to MC8 respectively connected to a plurality of word lines WL1 to WL8, and at least one string selection transistor SST respectively connected to one of the string selection lines SSL1, SSL2, SSL3, and SSL4.

In each string STR, the ground selection transistor GST, the memory cells MC1 to MC8, and the string selection transistor SST may be connected to each other in series in the vertical direction with respect to the substrate SUB and may be sequentially stacked in the vertical direction with respect to the substrate SUB. In each string STR, at least one of the memory cells MC1 to MC8 may be used as a dummy memory cell. The dummy memory cell may not be programmed, for example, the dummy memory cell may be prohibited to be programmed, or may be programmed differently from the other ones of the memory cells MC1 to MC8.

Describing the program operation and the verify operation for the memory block BLKa of FIG. 2, a program voltage may be applied to at least one of the word lines WLs during the program operation. Then, the bit lines BLs may be charged with a power supply voltage during the verify operation. A verify voltage may be provided to at least one of the word lines WLs, and a high voltage may be provided to the string selection line SSL, the ground selection line GSL, and non-selected word lines. A ground voltage (VSS) may be provided to the common source line CSL. The memory cells, which are connected to the non-selected word lines, the string selection transistor SST, and the ground selection transistor GST may be turned on. The memory cells connected to the selected word line may be turned on or turned off.

When a threshold voltage of the selected memory cell is higher than the verify voltage, the selected memory cell may be turned off. Accordingly, the bit line connected to the selected memory cell may be floated, and the power supply voltage may be maintained. When the threshold voltage of the selected memory cell is lower than the verify voltage, the selected memory cell may be turned on. Accordingly, the ground voltage (VSS) may be provided to the bit line connected to the selected memory cell from the common source line CSL.

The bit line connected to a program-passed memory cell may have a logic high, i.e., the power supply voltage. The bit line connected to a program-failed memory cell may have a logic low, i.e., the ground voltage (VSS). The voltages of bit lines BLs according to a verify read result are as shown in Table 1.

TABLE 1

|  | Program pass | Program fail |
|---|---|---|
| Bit line (BLs) | Logic High | Logic Low |

Hereinafter, the page buffer circuit 120, the page buffer decoder 125, and the fail bit counter 130 (see FIG. 1), which are used to determine the program pass and the program fail, will be described in detail.

Figure 3:
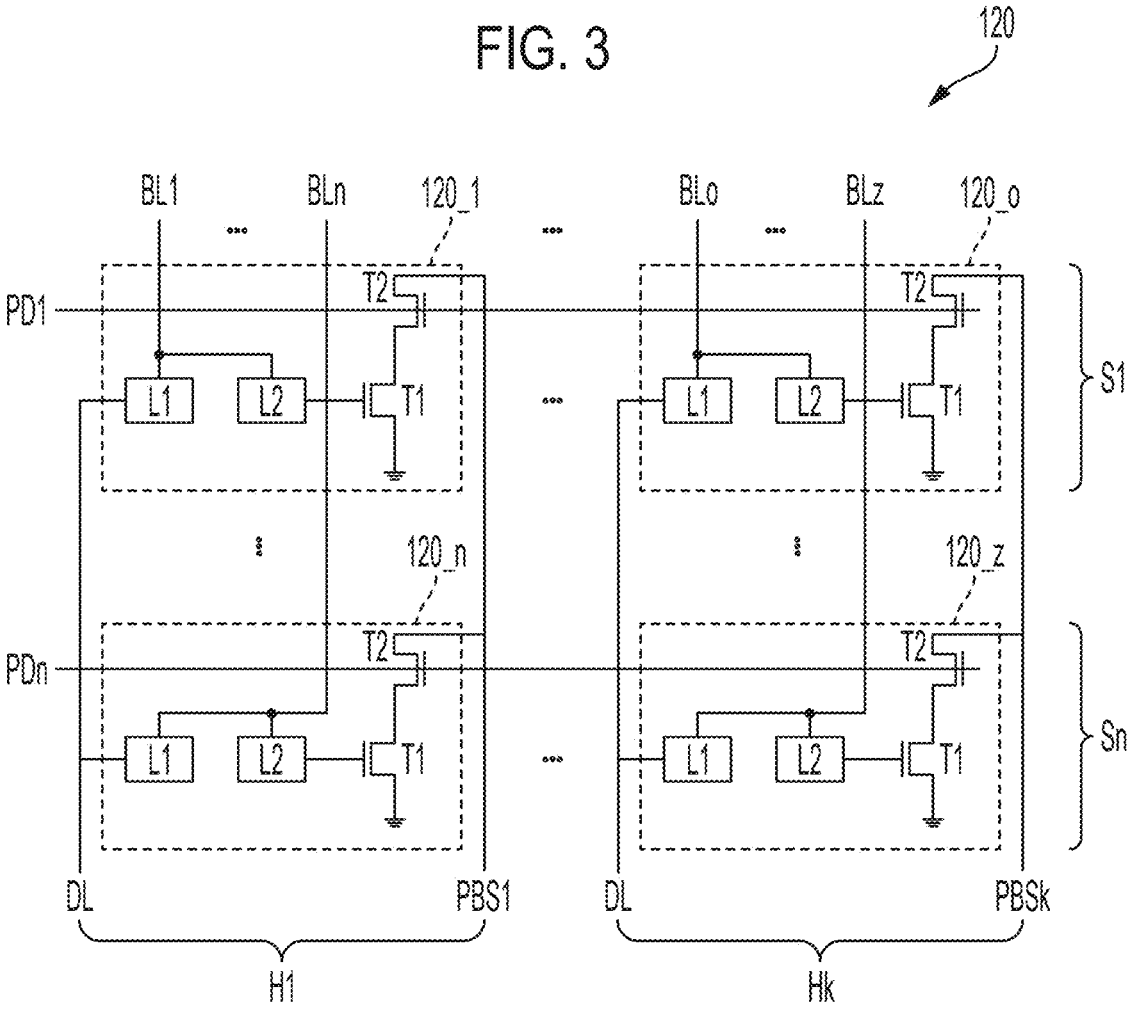
FIG. 3 is a circuit diagram illustrating a page buffer circuit according to some embodiments of the present disclosure.

FIG. 3 is a circuit diagram illustrating the page buffer circuit 120 according to some embodiments of the present disclosure.

Referring to FIG. 3, the page buffer circuit 120 may include a plurality of page buffers 120_1 to 120_z. The page buffers 120_1 to 120_z may form a plurality of multi-stage structures, and thus, the page buffer circuit 120 may include the multi-stage structures. As an example, the page buffers may form first multi-stage structures H1 to Hk defined in a first direction and second multi-stage structures S1 to Sn defined in a second direction. As an example, first to n-th page buffers 120_1 to 120_n may form a first-first multi-stage structure H1, and o-th to z-th page buffers 120_0 to 120_z may form a first-k-th multi-stage structure Hk.

The page buffers may be connected to each other in each multi-stage structure. As an example, the page buffers 120_1 to 120_n may be connected to each other in a wired-OR structure in the first-first multi-stage structure H1 and may output a first page buffer signal PBS1. The page buffers 120_o to 120_z may be connected to each other in the wired-OR structure in the first-k-th multi-stage structure Hk and may output a k-th page buffer signal PBSk.

Each of the page buffers 120_1 to 120_z may include a first latch L1, a second latch L2, a first transistor T1, and a second transistor T2. The first and second latches L1 and L2 may be connected to the bit lines BL1 to BLz. As an example, the first and second latches L1 and L2 of the first page buffer 120_1 may be connected to the first bit line BL1. The first and second latches L1 and L2 of the n-th page buffer 120_n may be connected to an n-th bit line BLn. The first and second latches L1 and L2 of the o-th page buffer 120_o may be connected to an o-th bit line BLo. The first and second latches L1 and L2 of the z-th page buffer 120_z may be connected to a z-th bit line BLZ.

The first latches L1 may be data latches that store data to be programmed, read results, and results of the verify operation. The first latches L1 may be connected to the data lines DL. The second latches L2 may operate independently from the first latches L1. The second latches L2 may store the results of the verify operation stored in the first latches L1. The second latches L2 may invert a value stored therein and may provide the inverted value to the first transistors T1.

The first transistors T1 may operate in response to the value stored in the second latches L2. The ground voltage (VSS) may be provided to one terminal of each of the first transistors T1, and the other terminal of each of the first transistors T1 may be connected to the second transistors T2. Terminals of an element described herein may also be referred to as a first terminal and a second terminal.

The second transistors T2 may operate in response to driving signals PD1 to PDn. One terminal of each of the second transistors T2 may be connected to the first transistors T1, and the first to k-th page buffer signals PBS1 to PBSk may be output via the other terminal of each of the second transistors T2.

When the verify operation is carried out, the results of the verify operation may be stored in the page buffers 120_1 to 120_z. According to the results of the verify operation, the page buffers 120_1 to 120_z may output the first to k-th page buffer signals PBS1 to PBSk. As an example, the page buffers 120_1 to 120_z may sequentially output the first to k-th page buffer signals PBS1 to PBSk in order of a second-first multi-stage structure S1 to a second-n-th multi-stage structure Sn.

When a first driving signal PD1 is activated, the page buffers 120_1 to 120_o of a first stage may output the first to k-th page buffer signals PBS1 to PBSk. When an n-th driving signal PDn is activated, the page buffers 120_n to 120_z of an n-th stage may output the first to k-th page buffer signals PBS1 to PBSk.

As shown in Table 1, the bit line connected to the program-failed memory cell may have the logic low, and the bit line connected to the program-passed memory cell may have the logic high. Logical values of the bit lines BL1 to BLz may be stored in the page buffers 120_1 to 120_z.

The second latch L2 of the first page buffer 120_1 may output a value obtained by inverting the stored value to a gate of the first transistor T1.

When the memory cell corresponding to the first page buffer 120_1 is the program-failed memory cell, the second latch L2 may output a logic high to the gate of the first transistor T1. That is, the first transistor T1 may be turned on. When the memory cell corresponding to the first page buffer 120_1 is the program-passed memory cell, the second latch L2 may output a logic low to the gate of the first transistor T1. That is, the first transistor T1 may be turned off.

When the first page buffer 120_1 corresponds to the program-failed memory cell and the first driving signal PD1 is activated, the first page buffer 120_1 may output the ground voltage (VSS) as the first page buffer signal PBS1. When the first page buffer 120_1 corresponds to the program-passed memory cell and the first driving signal PD1 is activated, the first page buffer 120_1 may float the first page buffer signal PBS1. Accordingly, when the first driving signal PD1 is activated, the first page buffer 120_1 may output the ground voltage (VSS) or may float the first page buffer signal PBS1 depending on whether the memory cell is the program-passed memory cell or the program-failed memory cell. The other page buffers may also operate in the same way as the first page buffer 120_1. The page buffer signals PBS1 to PBSk according to the results of the verify operation are as shown in Table 2.

TABLE 2

|  | Program pass | Program fail |
|---|---|---|
| Bit line (BLs) | Logic High | Logic Low |
| Page buffer signal (PBS) | Float | VSS |

Figure 4:
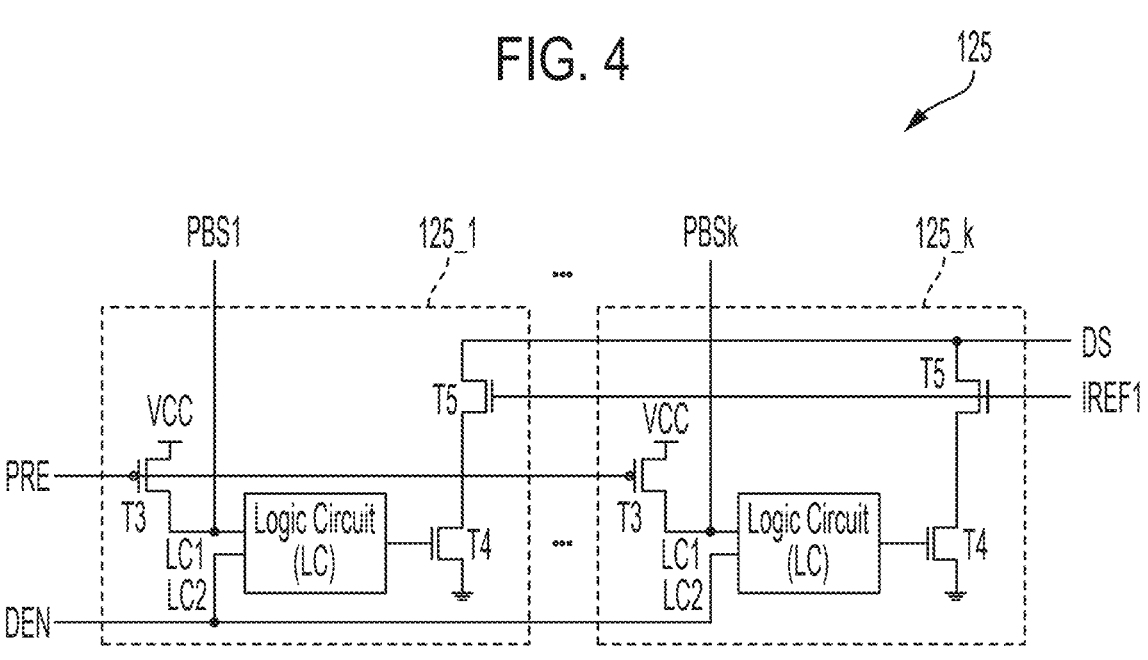
FIG. 4 is a circuit diagram illustrating a page buffer decoder according to some embodiments of the present disclosure.

FIG. 4 is a circuit diagram illustrating the page buffer decoder 125 according to some embodiments of the present disclosure.

Referring to FIG. 4, the page buffer decoder 125 may include a plurality of decoders 125_1 to 125_k. First to k-th decoders 125_1 to 125_k may receive the first to k-th page buffer signals PBS1 to PBSk from the page buffer circuit 120. The decoder enable signal DEN and the decoder precharge signal PRE may be commonly provided to the first to k-th decoders 125_1 to 125_k. The first to k-th decoders 125_1 to 125_k may output the decoding signal DS in response to the first to k-th page buffer signals PBS1 to PBSk. Each of the first to k-th decoders 125_1 to 125_k may include a third transistor T3, a fourth transistor T4, a fifth transistor T5, and a logic circuit LC.

The third transistors T3 may be connected to a first input terminal LC1 of the logic circuits LC, and the first to k-th page buffer signals PBS1 to PBSk may be applied to the first input terminal LC1 of the logic circuits LC. The third transistors T3 may precharge the first input terminal LC1 of the logic circuits LC to the power supply voltage VCC in response to the decoder precharge signal PRE. The decoder enable signal DEN may be applied to the second input terminal LC2 of the logic circuits LC. As an example, the logic circuits LC may be a device that performs a NOR operation.

The fourth transistors T4 may operate in response to outputs from the logic circuits LC. The ground voltage (VSS) may be provided to one terminal of each of the fourth transistors T4, and the other terminal of each of the fourth transistors T4 may be connected to the fifth transistors T5.

The fifth transistors T5 may operate in response to a first reference current IREF1. One terminal of each of the fifth transistors T5 may be connected to the fourth transistors T4, and the decoding signal DS may be output via the other terminal of each of the fifth transistors T5.

As an example, the logic circuits LC may output the logic high when both inputs are logic low and may output the logic low when at least one of both inputs is logic high. Accordingly, when the decoder enable signal DEN is logic high, the logic circuits LC may always output the logic low. That is, the page buffer decoder 125 may be deactivated. When the decoder enable signal DEN is logic low, the logic circuits LC may output the logic high or the logic low depending on the value of the first input terminal LC1. That is, the page buffer decoder 125 may be activated depending on the value of the first input terminal LC1.

When the driving signals are in a deactivated state, the first to k-th page buffer signals PBS1 to PBSk may be in a floating state. In this case, the third transistors T3 may precharge the first input terminal LC1 to the power supply voltage VCC in response to the decoder precharge signal PRE. In addition, the decoder precharge signal PRE may be deactivated, and the first input terminal LC1 of the logic circuits LC may be floated.

When one of the driving signals is activated, the second-first multi-stage structure S1 to the second-n-th multi-stage structure Sn of the page buffers 120_1 to 120_z may output the first to k-th page buffer signals PBS1 to PBSk.

When the memory cell corresponding to the first page buffer signal PBS1 is the program-passed memory cell, the first page buffer signal PBS1 may be in the floating state. The first input terminal LC1 of the logic circuit LC of the first decoder 125_1 may maintain the power supply voltage VCC, i.e., the logic high, and the logic circuit LC may output the logic low. Since the fourth transistor T4 is turned off, the output of the first decoder 125_1 may be floated.

When the memory cell corresponding to the first page buffer signal PBS1 is the program-failed memory cell, the first page buffer signal PBS1 may have the ground voltage (VSS). The voltage of the first input terminal LC1 of the logic circuit LC of the first decoder 125_1 may be transitioned to the ground voltage (VSS), i.e., the logic low, and the logic circuit LC may output the logic high. Accordingly, since the fourth transistor T4 is turned on, the first decoder 125_1 may serve as a current sink drawing a current from an output node. An amount of the current drawn through the first decoder 125_1 may be controlled by the first reference current IREF1. The current drawn through the first decoder 125_1 in response to the first reference current IREF1 may be a unit current (Iunit).

The other decoders may operate in the same way as the first decoder 125_1. The output signals from the decoders 125_1 to 125_k according to the results of the verify operation are as shown in Table 3.

TABLE 3

|  | Program pass | Program fail |
|---|---|---|
| Bit line (BLs) | Logic High | Logic Low |
| Page buffer signal (PBS) | Float | VSS |
| DS | Float | Iunit |

Figure 5:
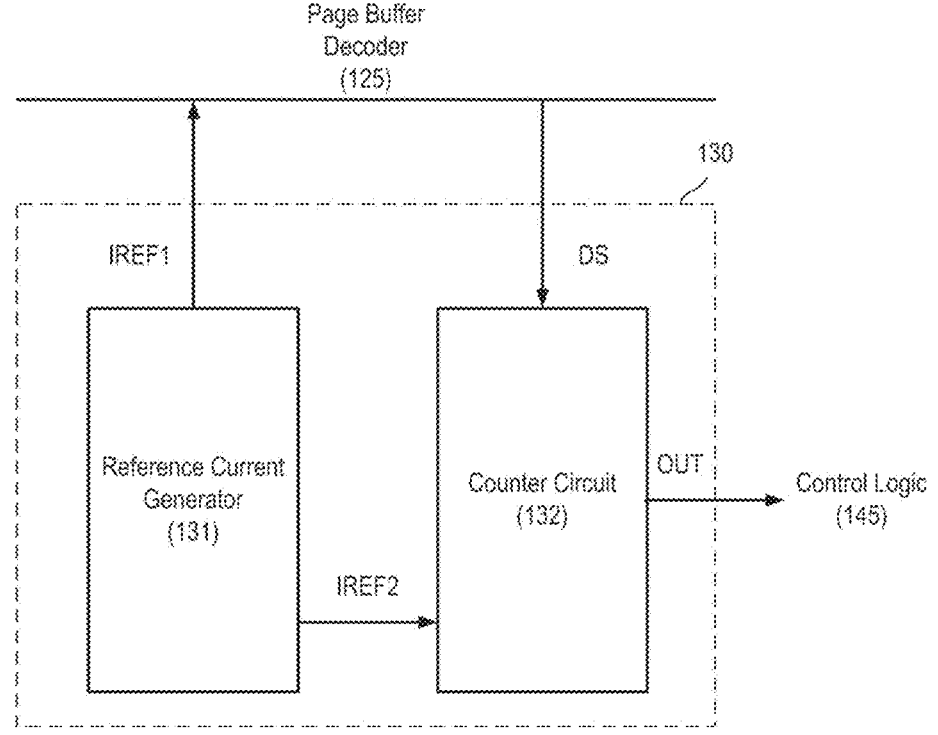
FIG. 5 is a block diagram illustrating a fail bit counter according to some embodiments of the present disclosure.

FIG. 5 is a block diagram illustrating the fail bit counter 130 according to some embodiments of the present disclosure.

Referring to FIG. 5, the fail bit counter 130 may include a reference current generator 131 and a counter circuit 132.

The reference current generator 131 may generate the first reference current IREF1 and a second reference current IREF2. The first reference current IREF1 may be output to the page buffer decoder 125, and the page buffer decoder 125 may operate based on the first reference current IREF1. As described above, the first reference current IREF1 may be applied to a common gate of the fifth transistor T5 included in the page buffer decoder 125, and the fifth transistor T5 may be turned on or off in response to the first reference current IREF1.

As an example, the reference current generator 131 may control a magnitude of the first reference current IREF1. As the magnitude of the first reference current IREF1 is controlled, the amount of the unit current drawn through the page buffer decoder 125 may be controlled. As an example, as the amount of the first reference current IREF1 increases, the amount of the unit current may increase.

The second reference current IREF2 may be output to the counter circuit 132, and the counter circuit 132 may operate based on the second reference current IREF2.

The counter circuit 132 may receive the decoding signal DS from the page buffer decoder 125 and may receive the second reference current IREF2 from the reference current generator 131. The counter circuit 132 may generate a comparative reference current (also referred to as a comparative reference current signal) based on the second reference current IREF2 to count the fail bit. The counter circuit 132 may compare a comparative reference voltage output based on the comparative reference current with a decoding signal voltage corresponding to the decoding signal DS. The counter circuit 132 may output the count signal OUT corresponding to the compared result to the control logic 145.

Figure 6:
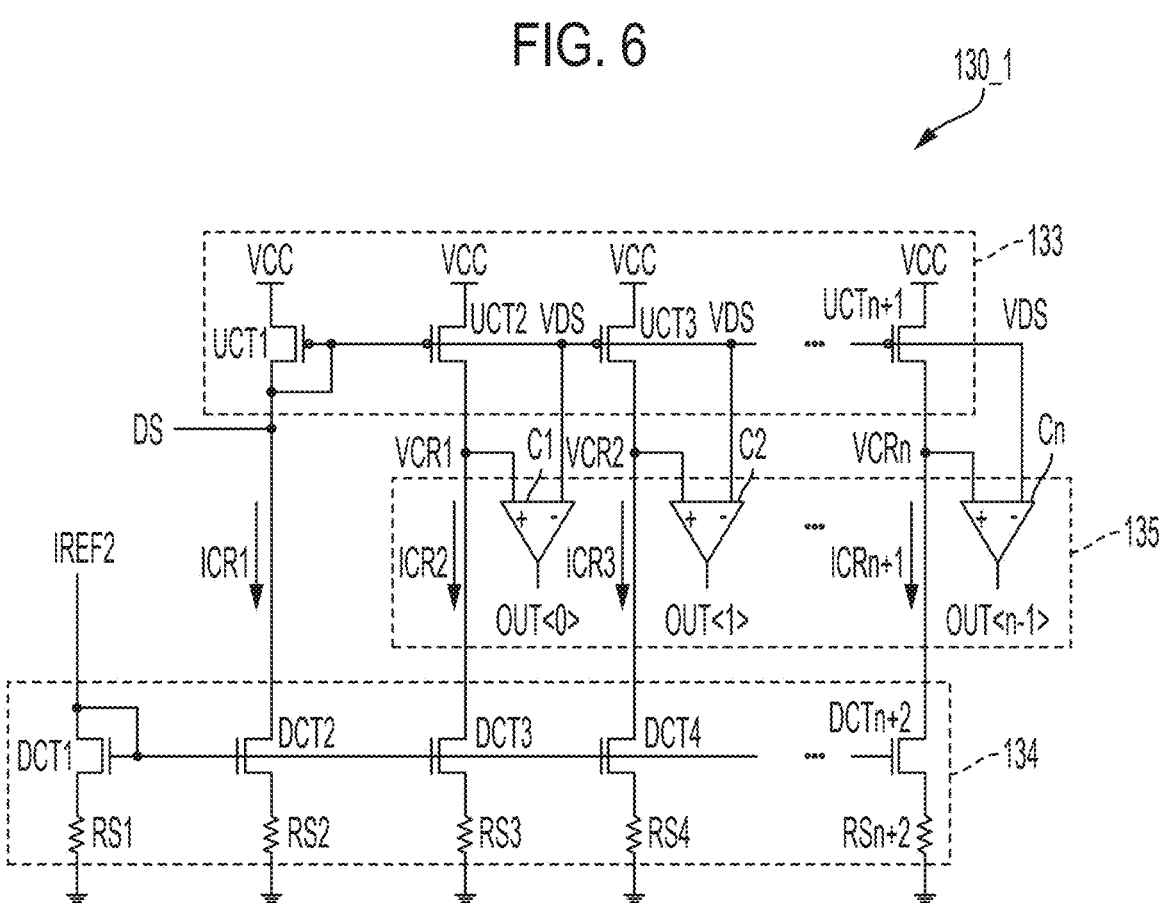
FIG. 6 is a circuit diagram illustrating a fail bit counter according to some embodiments of the present disclosure.

FIG. 6 is a circuit diagram illustrating a fail bit counter 130_1 according to some embodiments of the present disclosure.

Referring to FIG. 6, the fail bit counter 130_1 may include a first current mirror circuit 133, a second current mirror circuit 134, and a comparison circuit 135.

The first current mirror circuit 133 may include a plurality of UC transistors UCT1 to UCTn+1. For the sake of explanation, the UC transistor is defined to refer to a transistor included in the first current mirror circuit 133 located at an upper end with respect to the comparison circuit 135. The UC transistors UCT1 to UCTn+1 may include a common gate, and the decoding signal DS may be applied to the common gate. The decoding signal DS may be a signal output from the page buffer decoder 125 according to the number of the fail bits that are program-failed.

The power supply voltage VCC may be provided to one terminal of a first UC transistor UCT1, and an input signal from the point of view of the first current mirror circuit 133 may flow through the other terminal of the first UC transistor UCT1. In addition, the decoding signal DS may be applied to the first UC transistor UCT1. The power supply voltage VCC may be provided to one terminal of each of the other transistors, i.e., a second UC transistor UCT2 to an (n+1)th UC transistor UCTn+1, and a mirror current (also referred to as a mirror current signal) obtained by mirroring the input signal flowing through the other terminal of the first UC transistor UCT1 may flow through the other terminal of each of the second UC transistor UCT2 to the (n+1)th UC transistor UCTn+1.

According to some embodiments, the second UC transistor UCT2 to the (n+1)th UC transistor UCTn+1 may have the same size. In this case, mirror currents (also referred to as mirror current signals) output from the first current mirror circuit 133 may have the same magnitude.

The second current mirror circuit 134 may include a plurality of DC transistors DCT1 to DCTn+2. For the sake of explanation, the DC transistor is defined to refer to a transistor included in the second current mirror circuit 134 located at a lower end with respect to the comparison circuit 135. The DC transistors DCT1 to DCTn+2 may include a common gate, and the second reference current IREF2 signal may be applied to the common gate. The second reference current IREF2 signal may be output from the reference current generator 131 (see FIG. 5) according to the above embodiments. The first current mirror circuit 133 may be connected to one terminal of the DC transistors DCT1 to DCTn+2.

The second reference current IREF2 signal may be applied to the one terminal of a first DC transistor DCT1, and an input signal from the point of view of the second current mirror circuit 134 may flow through the other terminal of the first DC transistor DCT1. In addition, the other terminal of the first DC transistor DCT1 may be grounded. A mirror current obtained by mirroring the input signal flowing through the other terminal of the first DC transistor DCT1 may flow through the other transistors except the first DC transistor DCT1, i.e., a second DC transistor DCT2 to an (n+2)th DC transistor DCTn+2. Consequently, the second current mirror circuit 134 mirrors the second reference current IREF2 (also referred to as a second reference current signal) to output a plurality of comparative reference currents ICR1 to ICRn+1 (also referred to as a plurality of comparative reference current signals). In addition, for the sake of explanation, the mirror current output from the second current mirror circuit 134 may be defined as the comparative reference currents ICR1 to ICRn+1. Further, the other terminal of each of the second DC transistor DCT2 to the (n+2)th DC transistor DCTn+2 may be grounded.

According to some embodiments, the second DC transistor DCT2 to the (n+2)th DC transistor DCTn+2 may have different sizes. In this case, the mirror current output from the second current mirror circuit 134, i.e., the comparative reference currents ICR1 to ICRn+1, may have different magnitudes from each other. Accordingly, comparative reference voltages VCR1 to VCRn provided to one of input terminals of the comparison circuit 135 to be described later may have different levels (e.g., voltage levels) from each other depending on the magnitudes of the comparative reference currents ICR1 to ICRn+1. In addition, as the comparative reference currents ICR1 to ICRn+1 have different magnitudes, a count resolution of the fail bits counted by the fail bit counter may be adjusted.

However, in the case where the comparative reference currents ICR1 to ICRn+1 are generated based on the adjustment of the size of the DC transistors DCT1 to DCTn+2, a mismatch may occur between the DC transistors DCT1 to DCTn+2. In this case, the expression "mismatch" may mean that the comparative reference currents ICR1 to ICRn+1 output from the DC transistors DCT1 to DCTn+2 are changed without having an originally intended value.

As an example, referring to the page buffer circuit 120 of FIG. 3, when the page buffer circuit 120 includes the first multi-stage structures H1 to Hk and the second multi-stage structures S1 to Sn, the number of stages may be reduced depending on the generation of memory devices or changes in operation scheme. In this case, the number of the fail bits to be counted by the fail bit counter that counts the fail bits from the decoding signal DS may also increase.

Referring to FIG. 6 again, the fail bit counter for counting a larger number of the fail bits may be required to generate larger comparative reference currents ICR1 to ICRn+1. As an example, when assuming that the comparative reference currents ICR1 to ICRn+1 output respectively from the second DC transistor DCT2 to the (n+2)th DC transistor DCTn+2 sequentially increase, it may be required to generate the larger comparative reference currents ICR1 to ICRn+1 that become larger in a direction going toward the (n+2)th DC transistor DCTn+2 to count more fail bits. It may be understood that a value of the largest comparative reference current among the comparative reference currents ICR1 to ICRn+1 generated by the second current mirror circuit 134 should increase.

In addition, a possibility of the mismatch occurrence becomes higher in the DC transistor that is required to generate larger comparative reference currents ICR1 to ICRn+1 through mirroring. When the mismatch occurs, the comparative reference currents ICR1 to ICRn+1 are changed, and thus, it is highly likely that the fail bit counter miscalculates the number of the fail bits.

According to the present disclosure, a plurality of resistors RS1 to RSn+2 may be connected to the second current mirror circuit 134 to reduce the mismatch while increasing the number of the fail bits counted by the fail bit counter.

According to some embodiments, the resistors RS1 to RSn+2 may be connected to the other terminal of the DC transistors DCT1 to DCTn+2. For example, the resistors RS1 to RSn+2 may be respectively connected to the respective other terminals of the DC transistors DCT1 to DCTn+2. The resistor may be referred to as a degeneration resistor.

The respective other terminals of the DC transistors DCT1 to DCTn+2 may be respectively connected to respective one terminals of the resistors RS1 to RSn+2, and the respective other terminals of the resistors RS1 to RSn+2 may be grounded. The resistors RS1 to RSn+2 may correct the mismatch of the DC transistors DCT1 to DCTn+2. In detail, the resistors RS1 to RSn+2 may provide linearity to a gain of each of the DC transistors DCT1 to DCTn+2. Accordingly, as the resistors RS1 to RSn+2 are connected to the DC transistors DCT1 to DCTn+2, the comparative reference currents ICR1 to ICRn+1 may be linear with a resistance value. In addition, the comparative reference currents ICR1 to ICRn+1 may have a linear value with respect to the second reference current IREF2. As an example, among the comparative reference currents, one comparative reference current corresponding to one resistor among the resistors RS1 to RSn+2 may be linear with the one resistor. As the resistors RS1 to RSn+2 provide the linearity, errors in the fail bit count operation carried out through the comparison circuit 135, which will be described below, may be reduced.

The comparison circuit 135 may compare the decoding signal voltage VDS corresponding to the decoding signal DS with the comparative reference voltages VCR1 to VCRn output through the second current mirror circuit 134 and may output count signals OUT<0> to OUT<n–1> corresponding to the compared result. In other words, the comparison circuit 135 may determine a compared result by comparing the decoding signal voltage VDS corresponding to the decoding signal DS with the comparative reference voltages VCR1 to VCRn output through the second current mirror circuit 134 and may output count signals OUT<0> to OUT<n–1> corresponding to the compared result.

The comparison circuit 135 may include a plurality of comparators C1 to Cn. The comparative reference voltages VCR1 to VCRn may be applied to one of input terminals of each of the comparators C1 to Cn, and the decoding signal voltage VDS may be applied to the other of the input terminals of each of the comparators C1 to Cn. As an example, the comparative reference voltages VCR1 to VCRn may be applied with different values depending on the magnitude of the comparative reference currents ICR1 to ICRn+1, and the decoding signal voltage VDS may be applied with a common value.

The comparison circuit 135 may output the count signals OUT<0> to OUT<n–1> through the comparators C1 to Cn. The count signals OUT<0> to OUT<n–1> may have a number corresponding to the number of the comparators C1 to Cn. Each of the comparators C1 to Cn may compare one of the comparative reference voltages VCR1 to VCRn applied to the input terminal with the decoding signal voltage VDS.

As an example, when the decoding signal voltage VDS is greater than the one of the comparative reference voltages VCR1 to VCRn, the comparator may output the logic low. As an example, when the decoding signal voltage VDS is smaller than the one of the comparative reference voltages VCR1 to VCRn, the comparator may output the logic high.

As an example, as the number of the fail bits increases, the amount of the current drawn through the unit current may increase, and a level of the decoding signal DS may be reduced. That is, as the number of the fail bits increases, count signals OUT<0> to OUT<n–1> are output with more logic high, and as the number of the fail bits decreases, the count signals OUT<0> to OUT<n–1> are output with more logic low.

According to some embodiments, as the resistors RS1 to RSn+2 are additionally connected to the second current mirror circuit 134 that provides the comparative reference currents ICR1 to ICRn+1 to the comparison circuit 135 through the mirroring operation, the fail bit counter may reduce the mismatch between the transistors included in the second current mirror circuit 134. Accordingly, the comparative reference currents ICR1 to ICRn+1 output from the transistors included in the second current mirror circuit 134 may have the linearity proportional to the resistance value, and the mismatch may be reduced. Consequently, even when the fail bit counter counts a larger number of fail bits due to the decrease in the number of stages of the page buffer circuit 120, the fail bit counter 130 may count the fail bits without errors.

Figure 7:
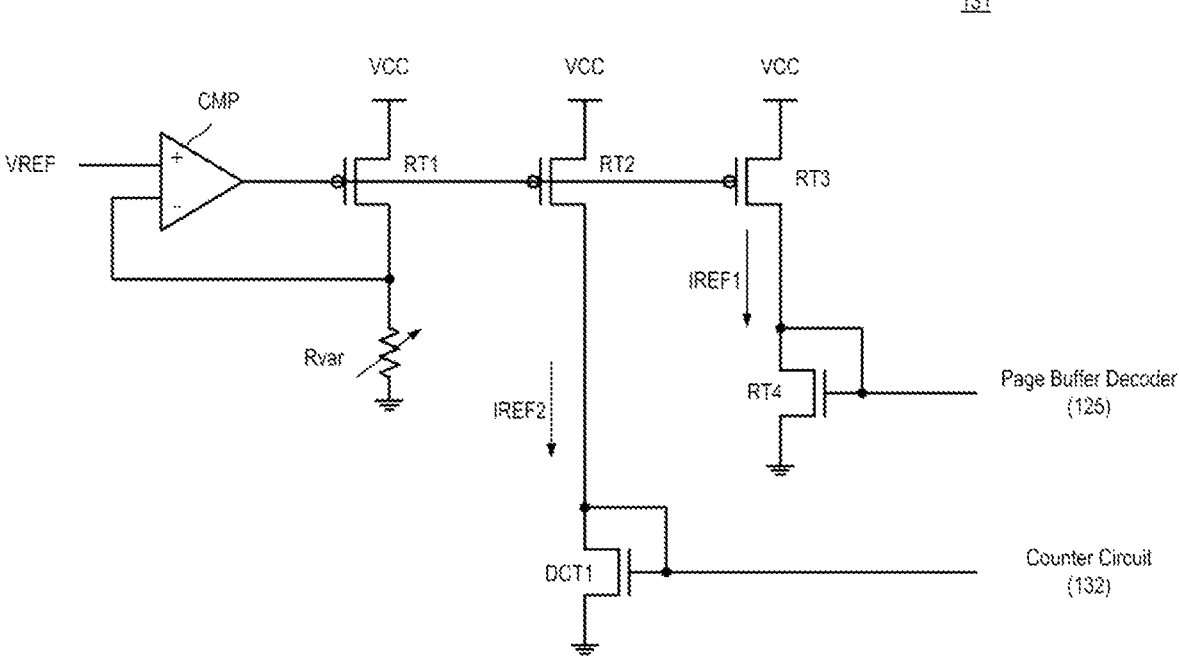
FIG. 7 is a circuit diagram illustrating a reference current generator according to some embodiments of the present disclosure.

FIG. 7 is a circuit diagram illustrating the reference current generator 131 according to some embodiments of the present disclosure.

Referring to FIG. 7, the reference current generator 131 may include a comparator CMP, a variable resistor Rvar, first, second, third, and fourth reference transistors RT1, RT2, RT3, and RT4, and the first DC transistor DCT1.

The reference voltage VREF may be provided to one of input terminals of the comparator CMP, and a voltage divided by the variable resistor Rvar may be provided to the other of the input terminals of the comparator CMP. As an example, the reference voltage VREF may be the power supply voltage VCC or may be various voltages used in the memory device. The reference voltage VREF may be supplied from the control logic 145 (see FIG. 1).

The variable resistor Rvar may have a variable resistance value. As an example, the resistance value of the variable resistor Rvar may vary according to the control by the control logic 145. Accordingly, an output signal of the comparator CMP may be changed depending on the resistance value of the variable resistor Rvar. In addition, the magnitude of the first reference current IREF1 and the magnitude of the second reference current IREF2 may vary depending on the resistance value of the variable resistor Rvar.

The first reference transistor RT1 may operate based on the output signal of the comparator CMP. The power supply voltage VCC may be provided to one terminal of the first reference transistor RT1, and the other terminal of the first reference transistor RT1 may be connected to the variable resistor Rvar and the other of the input terminals of the comparator CMP.

The first, second, and third reference transistors RT1, RT2, and RT3 may include a common gate, and the output signal of the comparator CMP may be applied to the common gate. The first, second, and third reference transistors RT1, RT2, and RT3 may form one current mirror circuit. In this case, the first reference transistor RT1 that operates based on the output signal of the comparator CMP may provide an input signal to the second reference transistor RT2 and the third reference transistor RT3.

The power supply voltage VCC may be provided to one terminal of the second reference transistor RT2, and one terminal of the first DC transistor DCT1 may be connected to the other terminal of the second reference transistor RT2. The second reference current IREF2 obtained by mirroring the input signal provided from the first reference transistor RT1 may flow through the other terminal of the second reference transistor RT2. The second reference current IREF2 may be supplied to the counter circuit 132 via the first DC transistor DCT1.

The power supply voltage VCC may be provided to one terminal of the third reference transistor RT3, and one terminal of the fourth reference transistor RT4 may be connected to the other terminal of the third reference transistor RT3. The first reference current IREF1 obtained by mirroring the input signal provided from the first reference transistor RT1 may flow through the other terminal of the third reference transistor RT3. The first reference current IREF1 may be supplied to the page buffer decoder 125 via the fourth reference transistor RT4.

The third reference transistor RT3 may have various sizes. The magnitude of the first reference current IREF1 may be controlled based on the variation in size of the third reference transistor RT3.

The third reference transistor RT3 may be connected to the one terminal of the fourth reference transistor RT4, and the other terminal of the fourth reference transistor RT4 may be grounded.

Figure 8:
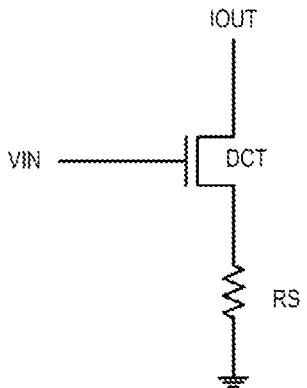
FIG. 8 is a circuit diagram illustrating a DC transistor shown in FIGS. 6 and 7.

FIG. 8 is a circuit diagram illustrating a DC transistor DCT as an example of the DC transistors shown in FIGS. 6 and 7.

Referring to FIG. 8, the DC transistor DCT may be connected to a resistor RS through the other terminal thereof. In a case where a gate voltage of the DC transistor DCT is defined as an input voltage VIN and a current flowing through one terminal of the DC transistor DCT is defined as an output current IOUT, a gain ($G_m$) defined by the input voltage VIN ($V_{in}$) and the output current IOUT ($i_{out}$) may be expressed as the following Equation 1.

$$G_m = \frac{i_{out}}{v_{in}} = \frac{g_m \cdot v_{gs}}{(1 + g_m \cdot RS) \cdot v_{gs}} \cong \frac{1}{RS} \qquad \text{Equation 1}$$

In Equation 1, $g_m$ denotes a small signal gain, and $V_{gs}$ denotes a voltage between a gate of the DC transistor DCT and the other terminal of the DC transistor DCT, which is connected to the resistor RS (e.g., a gate-to-source voltage).

As expressed by Equation 1, as the resistor RS is connected to the DC transistor DCT in series, resistance components $g_m$, $V_{gs}$, and RS may interfere with the input voltage VIN of the DC transistor DCT, and the input voltage VIN does not fully affect the output current IOUT. As the resistor RS increases, a dependence of the output current IOUT, that is, the above-mentioned comparative reference currents ICR1 to ICRn+1, on the DC transistor DCT may become lower. Accordingly, the comparative reference currents ICR1 to ICRn+1 may be linear with respect to the resistor RS, and the mismatch between the DC transistors DCT may be reduced.

Figure 9:
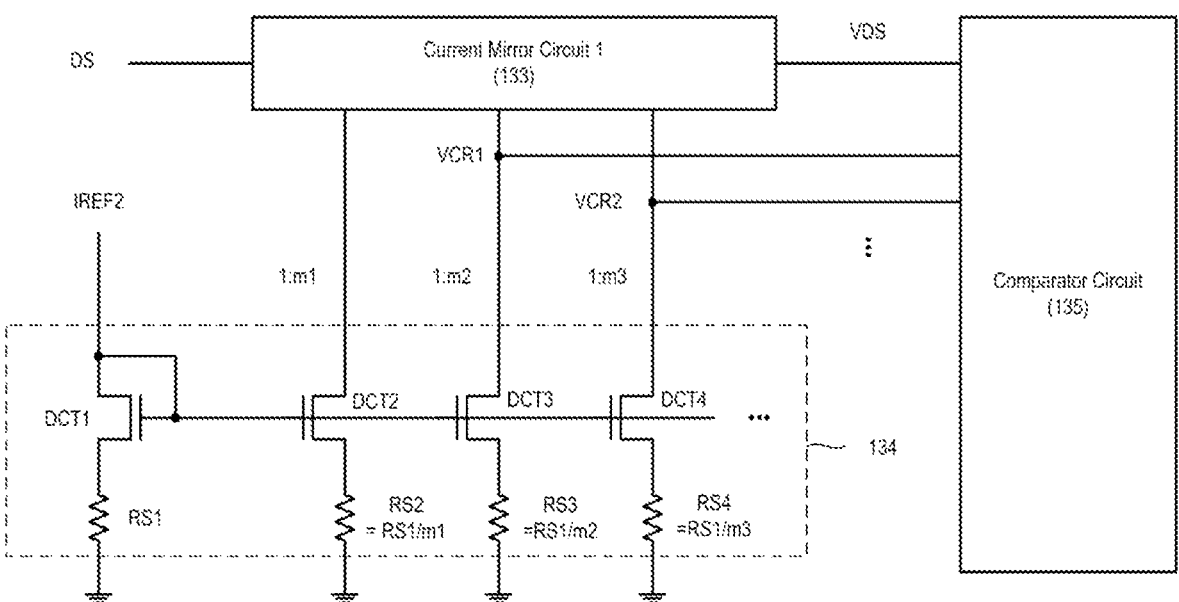
FIG. 9 is a circuit diagram illustrating a fail bit counter according to some embodiments of the present disclosure.

FIG. 9 is a circuit diagram illustrating the fail bit counter 130_1 according to some embodiments of the present disclosure. Hereinafter, details on the configurations or features of the fail bit counter which are the same as described above will be omitted for ease of description.

Referring to FIG. 9, the first current mirror circuit 133 included in the fail bit counter 130_1 may provide the decoding signal voltage VDS corresponding to the decoding signal DS to the comparison circuit 135 (also referred to as a comparator circuit).

In addition, the second current mirror circuit 134 may output the comparative reference current obtained by mirroring the second reference current IREF2. In this case, the comparative reference currents may have different mirroring ratios from each other. As an example, the comparative reference current output from the second DC transistor DCT2 may have the mirroring ratio of 1:m1, the comparative reference current output from the third DC transistor DCT3 may have the mirroring ratio of 1:m2, and the comparative reference current output from the fourth DC transistor DCT4 may have the mirroring ratio of 1:m3. As an example, the m1, m2, and m3 of the mirroring ratios may have different values from each other as the size of the second to fourth DC transistors DCT2 to DCT4 is adjusted. Accordingly, the comparative reference currents ICR1 to ICRn+1 may have different values from each other. For example, in the m1, m2, and m3 of the mirroring ratios, m is a natural number (e.g., a positive whole number).

First and second comparative reference voltages VCR1 and VCR2 provided to the comparison circuit 135 may be output based on the comparative reference current and the mirror current output through the first current mirror circuit 133. As an example, as the magnitude of the current drawn through the comparative reference current increases, the comparative reference voltage may become smaller. As an example, when the m3 is greater than the m2, the first comparative reference voltage VCR1 may be greater than the second comparative reference voltage VCR2. As an example, when the first resistor RS1, that is connected to the first DC transistor DCT1 outputting the input signal, is used as a reference in the second current mirror circuit 134, each of second, third, and fourth resistors RS2, RS3, and RS4 respectively connected to the second, third, and fourth DC transistors DCT2, DCT3, and DCT4 may have a resistance value defined based on the mirroring ratio. As an example, the resistance value of each of second, third, and fourth resistors RS2, RS3, and RS4 may be inversely proportional to the size of the mirroring ratio.

As an example, the second resistor RS2 may have the resistance value obtained by dividing the resistance value of the first resistor RS1 by the m1 (e.g., RS1/m1), the third resistor RS3 may have the resistance value obtained by dividing the resistance value of the first resistor RS1 by the m2 (e.g., RS1/m2), and the fourth resistor RS4 may have the resistance value obtained by dividing the resistance value of the first resistor RS1 by the m3 (e.g., RS1/m3). For example, the comparative reference currents may have different mirroring ratios from each other (e.g., 1:m1, 1:m2, and 1:m3), and the second, third, and fourth resistors RS2, RS3, and RS4 may have respective resistance values based on a respective one of the mirroring ratios.

According to the above embodiments, the resistors RS1 to RS4 connected to provide the linearity to the second current mirror circuit 134 may have different resistance values from each other depending on the comparative reference current output from the DC transistor connected to the resistors RS1 to RS4 and the mirroring ratio. Accordingly, the resistors RS1 to RS4 may allow a resistance value of a reference resistor, i.e., the resistance value of the first resistor RS1, and the comparative reference currents ICR1 to ICRn+1 to have the linearity regardless of the magnitude of the comparative reference currents ICR1 to ICRn+1 and the size of the DC transistor.

Figure 10:
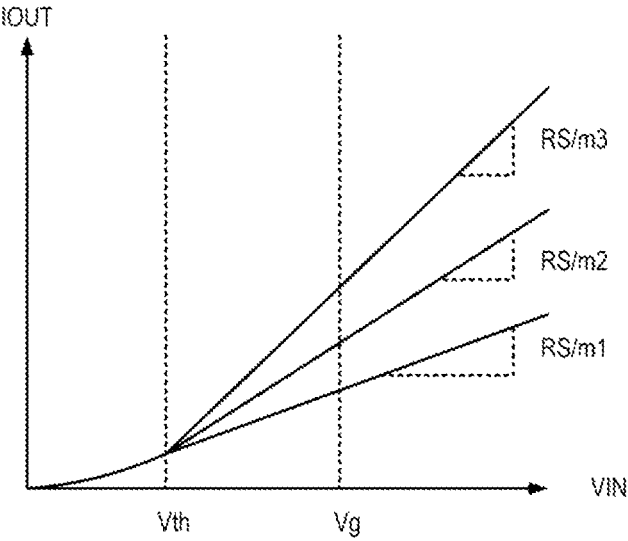
FIG. 10 is a graph illustrating an input voltage as a function of an output current of a DC transistor of FIG. 9.

FIG. 10 is a graph illustrating the input voltage as a function of the output current of the DC transistor of FIG. 9.

Referring to FIG. 10, when the input voltage VIN applied to the gate of the DC transistor is greater than the threshold voltage Vth, the linearity may be provided regardless of the size of the transistor. As an example, when the input voltage VIN has a specific gate voltage value Vg that is greater than the threshold voltage Vth, it is observed that both the input voltage VIN and the output current IOUT are linear.

In particular, the fail bit counter according to the present disclosure may provide the linearity regardless of the magnitude of the comparative reference current output from each DC transistor since the resistor connected to the DC transistor has the resistance value according to the mirroring ratio.

FIGS. 11 to 14 are diagrams illustrating count signals of fail bit counters according to some embodiments of the present disclosure.

Referring to FIG. 11, comparative reference voltages VCR1 to VCR10 applied to a comparison circuit 135 may include first, second, third, fourth, fifth, sixth, seventh, eighth, ninth, and tenth comparative reference voltages VCR1 to VCR10, and a decoding signal voltage VDS may have a value between the eighth and ninth comparative reference voltages VCR8 and VCR9. When the decoding signal voltage VDS is smaller than the comparative reference voltages VCR1 to VCR10, the comparison circuit 135 may output the logic low, and when the decoding signal voltage VDS is greater than the comparative reference voltages VCR1 to VCR10, the comparison circuit 135 may output the logic high. Accordingly, a count signal OUT< > output from the comparison circuit 135 in FIG. 11 may have a value of <1111111100>.

As an example, when a criterion of a program pass is <1110000000>, a control logic 145 (see FIG. 1) may determine a program operation as a program fail. Accordingly, the memory device may perform the program operation and a verify operation again based on an adjusted program voltage. For example, as the program voltage increases, the number of the fail bits may decrease, and thus, the level of the decoding signal voltage VDS may increase.

Figure 12:
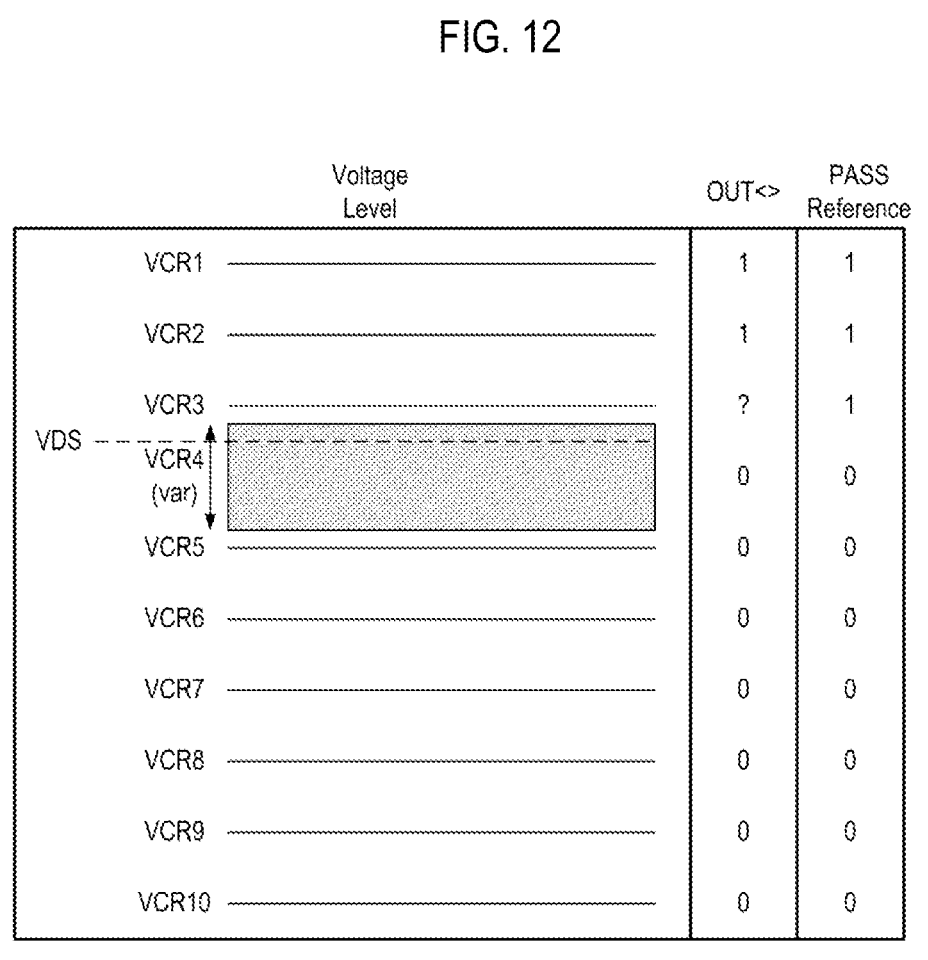

In this case, when a mismatch occurs between DC transistors outputting a comparative reference current in the fail bit counter as described above, the comparative reference current and the comparative reference voltages VCR1 to VCR10 may be changed as shown in FIG. 12. As an example, when a value of a fourth comparative reference voltage VCR4 is changed as shown in FIG. 12, there is a possibility that the fail bit counter miscalculates when comparing the decoding signal voltage VDS with the fourth comparative reference voltage VCR4. Although the fourth comparative reference voltage VCR4 is shown as a reference in FIG. 12, a possibility of a variation in the comparative reference voltage increases as the comparative reference voltage corresponds to a larger comparative reference current, e.g., as it approaches the tenth comparative reference voltage VCR10.

As an example, when assuming that the fourth comparative reference voltage VCR4 is changed to a fourth-first comparative reference voltage VCR4-1 according to the mismatch of the DC transistor as shown in FIG. 13, the decoding signal voltage VDS may be smaller than the fourth-first comparative reference voltage VCR4-1. Accordingly, the fail bit counter may output the count signal OUT< > with the logic high with respect to the comparator to which the fourth-first comparative reference voltage VCR4-1 is applied.

On the other hand, in the case where the resistor is connected to the second current mirror circuit 134, the linearity may be guaranteed for each of the comparative reference voltages VCR1 to VCR10. Accordingly, the fourth comparative reference voltage VCR4 may have a fourth-second comparative reference voltage VCR4-2 that is a normal value as shown in FIG. 14. In this case, since the decoding signal voltage VDS is greater than the fourth-second comparative reference voltage VCR4-2, the fail bit counter may output the count signal OUT< > with the logic low with respect to the comparator to which the fourth-second comparative reference voltage VCR4-2 is applied. Accordingly, the count signal OUT< > may meet the program pass criterion, and thus, the control logic 145 may finally determine the program pass.

According to the above embodiments of the present disclosure, as the resistor is connected to the DC transistors included in the second current mirror circuit 134 in series, the mismatch between the DC transistors may be relieved. Accordingly, the variability of the comparative reference currents ICR1 to ICRn+1 and the comparative reference voltages VCR1 to VCR10 to output the count signal OUT< > may be eliminated, and the reliable fail bit counting operation may be provided.

Figure 15:
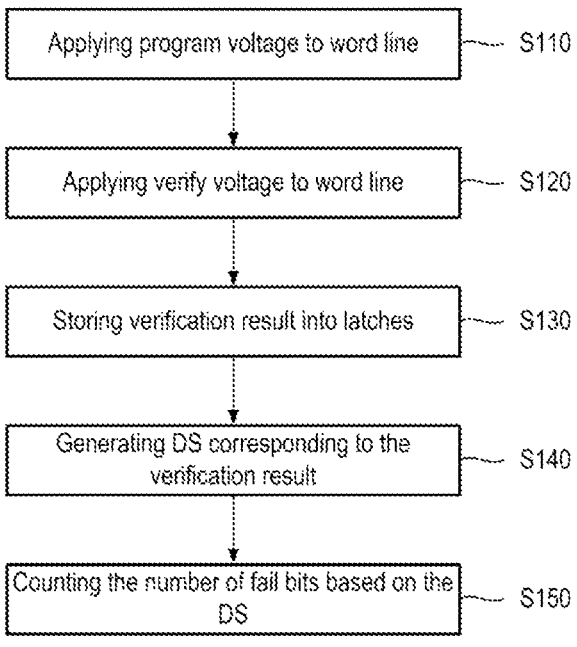
FIG. 15 is a flowchart illustrating a method of operating a memory device according to some embodiments of the present disclosure.

FIG. 15 is a flowchart illustrating a method of operating the memory device according to some embodiments of the present disclosure.

Referring to FIG. 15, the memory device 100 (see FIG. 1) may apply the program voltage to the selected word line among the word lines (S110).

The memory device 100 may apply the verify voltage to the selected word line among the word lines (S120). As an example, the verify voltage may be smaller than the program voltage.

The memory device 100 may store the verification result according to the application of the verify voltage (S130). As an example, the memory device 100 may store the verification result into the latches L1 and L2 included in the page buffer circuit 120 (see FIG. 3).

The memory device 100 may generate the decoding signal DS corresponding to the verification result (S140). As an example, the memory device 100 may decode the verification result stored in the page buffer circuit 120 using the page buffer decoder 125 and may generate the decoding signal DS.

The memory device 100 may count the number of the fail bits based on the decoding signal DS (S150). In this case, the memory device 100 may count the number of the fail bits using the fail bit counter including the resistors RS1 to RSn+2 (see FIG. 6) that provide the linearity and thus may perform the verify operation without errors. In particular, even though the number of the fail bits to be counted by the fail bit counter of the present disclosure increases, the linearity may be guaranteed through the resistors RS1 to RSn+2.

Figure 16:
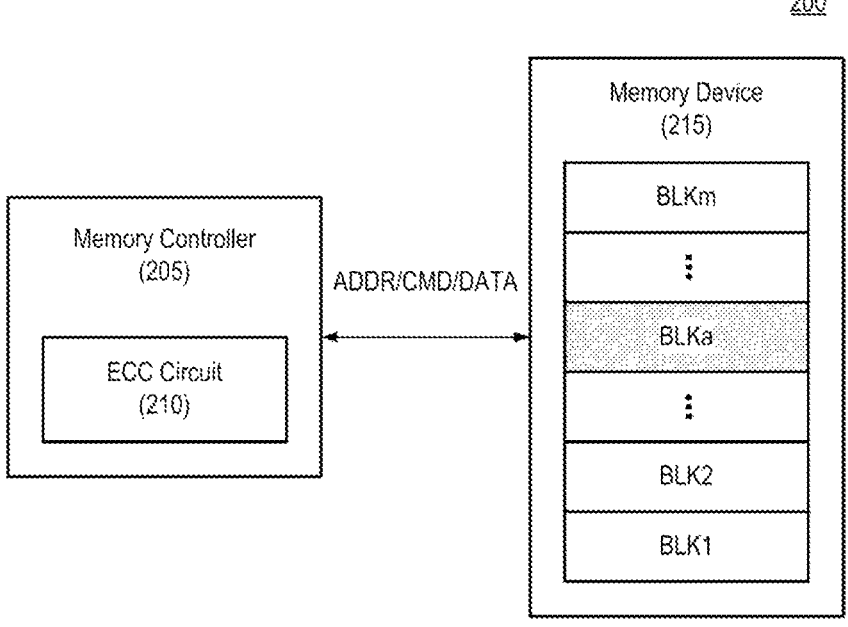
FIG. 16 is a block diagram illustrating a storage device according to some embodiments of the present disclosure.

FIG. 16 is a block diagram illustrating a storage device 200 according to some embodiments of the present disclosure.

Referring to FIG. 16, the storage device 200 may include a memory controller 205 and a memory device 215.

The memory controller 205 may be configured to control an overall operation of the memory device 215. The memory controller 205 may be configured to access the memory device 215. As an example, the memory controller 205 may be configured to control read, program or write, erase, and background operations of the memory device 215. The memory controller 205 may be configured to drive a firmware that drives and controls the memory device 215.

The memory controller 205 may provide an address signal ADDR, a command signal CMD, and data DATA to the memory device 215. Responsive to the address signal ADDR, the command signal CMD, and the DATA from the memory controller 205, the memory device 215 may be configured to perform the read, program or write, erase, and background operations. In addition, the memory controller 205 may receive the data DATA read form the memory device 215.

The memory controller 205 may include an ECC circuit 210.

The ECC circuit 210 may perform an error correction encoding operation on the data DATA and may generate data to which a parity bit is added. The parity bit may be stored in the memory device 215.

The ECC circuit 210 may detect and correct errors of the data DATA read from the memory device 215. As an example, the ECC circuit 210 may generate an error correction code for the data DATA to be stored in the memory device 215. The generated error correction code may be stored in the memory device 215 with the data DATA.

Then, the ECC circuit 210 may detect and correct the errors of the data DATA read from the memory device 215 based on the stored error correction code. That is, the ECC circuit 210 may have a predetermined error correction capability.

The memory device 215 may receive the address signal ADDR, the command signal CMD, and the data DATA from the memory controller 205. The memory device 215 may store the data DATA in a plurality of memory blocks BLK1 to BLKm based on the address signal ADDR and the command signal CMD. As an example, the memory device 215 may correspond to the memory device 100 of FIG. 1.

The memory device 215 may program the data DATA in the memory blocks BLK1 to BLKm based on the program voltage. The memory device 215 may perform the verify operation to determine whether the program is normally executed after the program operation. Among the memory cells included in the memory blocks BLK1 to BLKm, the memory device 215 may determine the memory cell in which the program is normally executed as the program-passed memory cell and may determine the memory cell in which the program is failed as the program-failed memory cell.

In detail, the memory device 215 may count the number of the fail bits according to the verify operation. The memory device 215 may generate a current corresponding to the fail bits and may count the fail bits based on the generated current. In this case, the memory device 215 may count the number of the fail bits using the fail bit counter according to the above embodiments. The memory device 215 may perform an incremental step pulse program (ISPP) operation that repeats a program loop according to the number of the counted fail bits. When the number of the fail bits that are correctable by the error correction capability supported by the above-described ECC circuit 210 through the ISPP operation is detected, the memory device 215 may determine the memory cell as the program-passed memory cell and may end the program operation.

Figure 17:
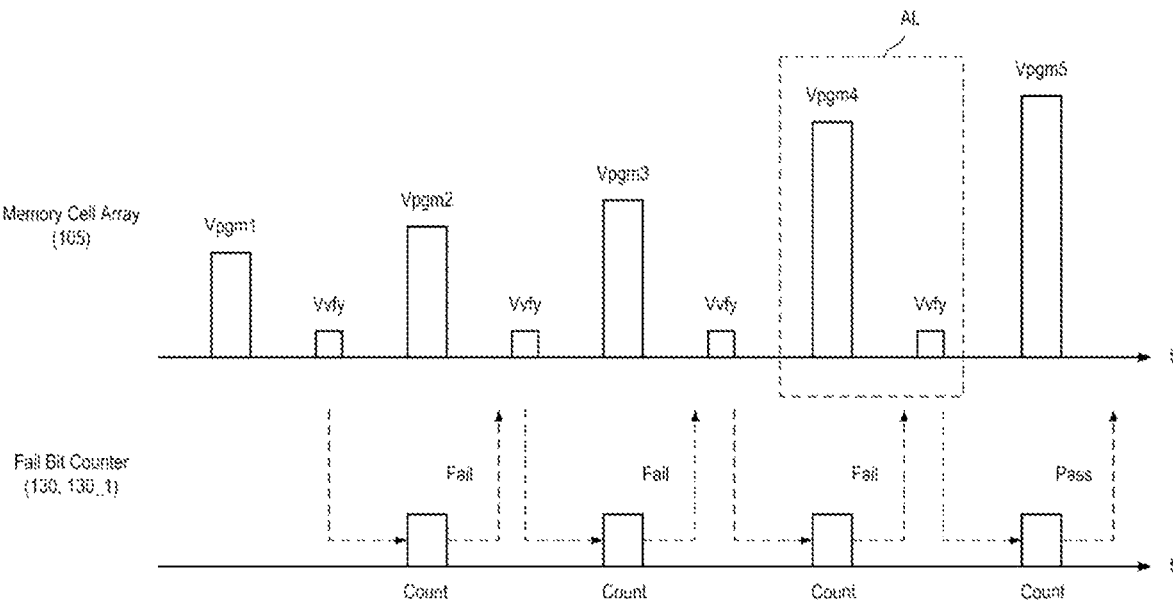
FIGS. 17 and 18 are diagrams illustrating an ISPP operation according to some embodiments of the present disclosure.
Figure 18:
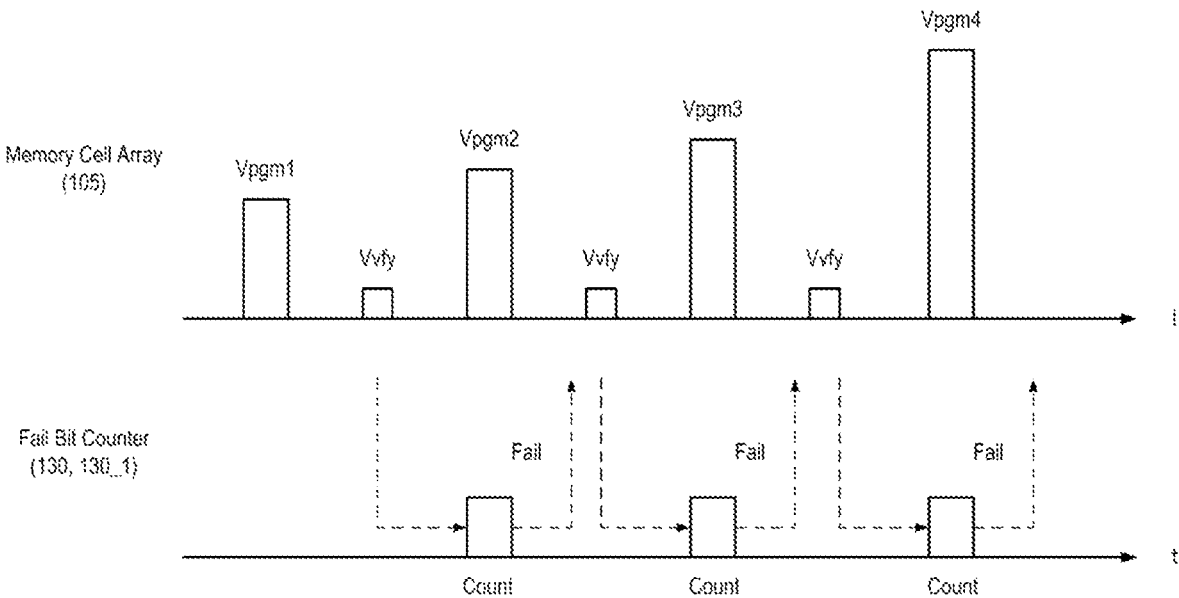

FIGS. 17 and 18 are diagrams illustrating an ISPP operation according to some embodiments of the present disclosure.

The memory devices 100 and 215 may perform the ISPP operation through one or more program loops. One program loop may include the program operation and the verify operation. The memory devices 100 and 215 may apply the program voltage to the memory cell array 105 during the program operation and may apply the verify voltage Vvfy to the memory cell array 105 during the verify operation. The fail bit counters 130 and 130_1 may count the number of the fail bits with or without the verify voltage Vvfy.

The memory devices 100 and 215 may compare the number of the counted fail bits with the specific value or the program pass reference and may determine the program pass or the program fail according to the compared result. When the program operation is finally determined as the program pass, the ISPP operation may be terminated.

Referring to FIG. 17, the memory devices 100 and 215 may apply a first program voltage Vpgm1, may apply the verify voltage Vvfy, and may determine the program fail based on the number of the counted fail bits. The memory devices 100 and 215 may repeat a program loop that sequentially applies second to fifth program voltages Vpgm2 to Vpgm5 with the verify voltage Vvfy until the program operation is determined as the program pass based on the number of the fail bits.

When assuming that the mismatch occurs between the DC transistors included in the fail bit counters 130 and 130_1, the memory devices 100 and 215 may count the bit that originally corresponds to the program pass as the program fail due to the changed comparative reference voltages VCR1 to VCRn. In this case, the memory devices 100 and 215 may perform the program loop again, and thus, additional program loop may be generated.

Then, referring to FIG. 18, in the case where the resistors RS1 to RSn+2 are provided for consistency matching to the fail bit counters 130 and 130_1 according to embodiments of the present disclosure, the variability of the comparative reference voltages VCR1 to VCRn may be eliminated. Accordingly, the memory devices 100 and 215 may perform the ISPP operation based on the normal comparative reference voltages VCR1 to VCRn, and thus, the additional program loop of FIG. 17 may be omitted.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

While the present disclosure has been described with reference to example embodiments thereof, it will be apparent to those of ordinary skill in the art that various changes and modifications may be made thereto without departing from the scope of the present disclosure as set forth in the following claims.

What is claimed is:

1. A device comprising:

a first current mirror circuit comprising a plurality of first transistors, the plurality of first transistors comprising a common gate configured to receive a decoding signal according to a number of fail bits that are program-failed;

a second current mirror circuit comprising:

a plurality of second transistors comprising a common gate configured to receive a reference current signal; and a plurality of resistors respectively electrically connected to respective first terminals of the plurality of second transistors; and a comparison circuit configured to determine a compared result by comparing a first voltage corresponding to the decoding signal with respective ones of a plurality of second voltages output from the second current mirror circuit, and configured to output a count signal corresponding to the compared result.

2. The device of claim 1, wherein ones of the plurality of second voltages have different values from each other when respective ones of the plurality of second transistors have different sizes from each other.

3. The device of claim 1, wherein the second current mirror circuit is configured to output a plurality of comparative reference current signals obtained by mirroring the reference current signal.

4. The device of claim 3, wherein a respective one of the plurality of comparative reference current signals, which corresponds to a respective one of the plurality of resistors, has a linear gain with respect to a resistance value of the respective one of the plurality of resistors.

5. The device of claim 1, wherein the count signal indicates the number of the fail bits.

6. The device of claim 3, wherein some of the plurality of second transistors respectively comprise second terminals respectively electrically connected to respective first terminals of the plurality of first transistors, wherein the plurality of second voltages are output based on the plurality of comparative reference current signals and a plurality of mirror current signals, and wherein the plurality of mirror current signals are output by the first current mirror circuit.

7. The device of claim 1, wherein respective first terminals of the plurality of resistors are respectively electrically connected to the respective first terminals of the plurality of second transistors, and wherein respective second terminals of the plurality of resistors are grounded.

8. The device of claim 3, wherein ones of the plurality of comparative reference current signals have different mirroring ratios from each other, and wherein at least one of the plurality of resistors has a resistance value based on a respective one of the mirroring ratios.

9. The device of claim 8, wherein the resistance value is inversely proportional to a size of the respective one of the mirroring ratios.

10. The device of claim 3, wherein each of the plurality of comparative reference current signals has a linear gain value with respect to the reference current signal.

11. A memory device comprising:

a memory cell array;

a page buffer circuit electrically connected to the memory cell array via a bit line, wherein the page buffer circuit is configured to output a page buffer signal corresponding to a result of a verify operation with respect to a program operation;

a page buffer decoder configured to decode the page buffer signal and output a decoding signal corresponding to fail bit information;

a fail bit counter configured to output a count signal corresponding to a number of fail bits with respect to the program operation based on the decoding signal; and a control circuit configured to determine a program pass or a program fail of the program operation based on the count signal, wherein the fail bit counter comprises:

a first current mirror circuit configured to output a first voltage corresponding to the decoding signal;

a plurality of transistors comprising a common gate configured to receive a reference current signal, wherein ones of the plurality of transistors further comprise respective first terminals electrically connected to the first current mirror circuit, and wherein the plurality of transistors are configured to output a plurality of comparative reference current signals obtained by mirroring the reference current signal;

a plurality of resistors respectively electrically connected to respective second terminals of the plurality of transistors; and a comparison circuit configured to determine a compared result by comparing the first voltage corresponding to the decoding signal with respective ones of a plurality of second voltages corresponding to the plurality of comparative reference current signals, and configured to output the count signal corresponding to the compared result.

12. The memory device of claim 11, wherein a respective one of the plurality of comparative reference current signals, which corresponds to a respective one of the plurality of resistors, has a linear gain with respect to a resistance value of the respective one of the plurality of resistors.

13. The memory device of claim 11, wherein ones of the plurality of comparative reference current signals have different mirroring ratios from each other, and wherein at least one of the plurality of resistors has a resistance value based on a respective one of the mirroring ratios.

14. The memory device of claim 11, wherein the page buffer circuit has a plurality of multi-stage structures, and wherein the count signal has a voltage level that increases as a number of the plurality of multi-stage structures increases.

15. A device comprising:

a first current mirror circuit configured to receive a decoding signal according to a number of fail bits that are program-failed, and configured to output a first voltage corresponding to the decoding signal;

a second current mirror circuit configured to output a plurality of comparative reference current signals based on a reference current signal; and a comparison circuit configured to determine a compared result by comparing the first voltage with respective ones of a plurality of second voltages corresponding to the plurality of comparative reference current signals, and configured to output a count signal corresponding to the compared result, wherein the second current mirror circuit comprises:

a first transistor comprising a first terminal configured to receive the reference current signal and a second terminal electrically connected to a first resistor; and a plurality of second transistors, the plurality of second transistors comprising:

a common gate that is electrically connected to a gate of the first transistor;

respective third terminals through which the plurality of comparative reference current signals are configured to flow; and respective fourth terminals electrically connected to respective ones of a plurality of second resistors.

16. The device of claim 15, wherein ones of the plurality of comparative reference current signals have different mirroring ratios from each other, and wherein each of the plurality of second resistors has a resistance value based on a respective one of the mirroring ratios.

17. The device of claim 15, wherein one of the plurality of comparative reference current signals has a mirroring ratio of m, wherein m is a natural number, and wherein one of the plurality of second resistors has a resistance value defined by a ratio of a resistance value of the first resistor to the m.

18. The device of claim 15, wherein ones of the plurality of second voltages have different values from each other when respective ones of the plurality of second transistors have different sizes from each other.

19. The device of claim 15, wherein the count signal has a resolution that is adjusted when ones of the plurality of second transistors have different sizes from each other.

20. The device of claim 15, wherein each of the plurality of comparative reference current signals has a linear gain value with respect to the reference current signal.

\* \* \* \* \*